United States Patent [19]

Seki

[11] Patent Number: 5,418,753
[45] Date of Patent: May 23, 1995

[54] DYNAMIC RANDOM ACCESS MEMORY DEVICE INCORPORATING TRANSFER GATES BETWEEN MEMORY CELL ARRAY AND SENSE AMPLIFIER ENABLED IN STANDARD MODES ONLY

[75] Inventor: Kazumi Seki, Tokyo, Japan

[73] Assignee: NEC Corporation, Tokyo, Japan

[21] Appl. No.: 151,130

[22] Filed: Nov. 12, 1993

[30] Foreign Application Priority Data

Nov. 13, 1992 [JP] Japan ................... 4-303437

[51] Int. Cl.⁶ ............................................. G11C 7/00
[52] U.S. Cl. ............................. 365/222; 365/207
[58] Field of Search ............. 365/222, 202, 203, 207

[56] References Cited

U.S. PATENT DOCUMENTS 5,208,779  5/1993  Walther et al. ..................... 365/222
5,270,982  12/1993  Watanabe ........................... 365/222
5,299,168  3/1994  Kang .................................. 365/222

Primary Examiner—Do Hyun Yoo
Attorney, Agent, or Firm—Sughrue, Mion, Zinn, Macpeak & Seas

[57] ABSTRACT

A transfer gate unit incorporated in a dynamic random access memory device blocks sense amplifier circuits from associated bit line pairs for decreasing the load of the sense amplifier circuits, and conducts the sense amplifier circuits with the bit line pairs again upon completion of the sense amplification for restoring the data bits in a standard read-out cycle; however, the transfer gate unit keeps the conductive paths between the sense amplifier circuits and the bit line pairs during a refreshing cycle so as to decrease current consumption due to the charge and discharge of the signal line coupled with the transfer gate unit.

4 Claims, 5 Drawing Sheets

DYNAMIC RANDOM ACCESS MEMORY DEVICE INCORPORATING TRANSFER GATES BETWEEN MEMORY CELL ARRAY AND SENSE AMPLIFIER ENABLED IN STANDARD MODES ONLY

FIELD OF THE INVENTION

This invention relates to a dynamic random access memory device and, more particularly, to a dynamic random access memory cell device having a transfer gate unit between a memory cell array and a sense amplifier unit differently controlled between a standard mode and a refreshing mode.

DESCRIPTION OF THE RELATED ART

A typical example of the dynamic random access memory device is illustrated in FIG. 1 of the drawings, and largely a memory cell array 1 implemented by a plurality of memory cells arranged in rows and columns. The rows of memory cells are respectively associated with word lines WL1, WL2, WL3 and WLm, and the columns of memory cells are coupled with bit line pairs. Although the memory cell array 1 has a plurality of columns of memory cells, only one column of memory cells M1, M2, M3 and Mm are shown in FIG. 1, and a bit line pair BLa/BLb is coupled with the column of memory cells M1 to Mm. The memory cells M1 to Mm is of the one-transistor and one-capacitor type, and the word lines WL1 to WLm are connected with the gate electrodes of the switching transistors of the memory cells M1 to Mm.

A row address decoder/word line driver unit 2 is coupled with the word lines WL1 to WLm, and is responsive to address predecoded signals produced from an external row address signal or a refresh address signal from a refresh control system 3 for selectively energizing the word lines WL1 to WLm. When one of the word lines WL1 to WLm goes up over a positive power voltage level Vcc, the capacitor of the selected memory cell is conducted with the bit line pair BLa/BLb.

A precharge circuit 4 is coupled between a precharge voltage line Vcc/2 and the bit line pair BLa/BLb, and charges and equalizes the bit lines BLa and BLb at an intermediate voltage level between the positive power voltage level Vcc and the ground voltage level in response to a precharge control signal EQ. The precharge control signal EQ is produced by a control signal generator 5. When the capacitor of the selected memory cell is conducted with either bit line BLa or BLb, small potential difference takes place between the bit lines BLa and BLb.

A sense amplifier circuit 6 is provided for the column of memory cells M1 to Mm, and has a pair of sense nodes SA1 and SA2 connectable through a transfer gate unit 7 with the bit lines BLa and BLb. The sense amplifier circuit 6 is powered through the power voltage lines SEP and SEN, and develops or increases the small potential difference supplied through the transfer gate unit 7.

The transfer gate unit 7 is responsive to a gate control signal TG, and the gate control signal TG is produced by a control signal generator 8.

A column selector unit 9 is further associated with the column of memory cells M1 to Mm, and is responsive to column address decoded signals, and a column address decoder unit (not shown) causes the column address decoded signals to selectively go up to the positive power voltage level. When the column selector unit 9 conducts the sense nodes SA1 and SA2 with a pair of data bus lines 10, the potential difference is transferred from the sense nodes SA1 and SA2 to the pair of data bus lines 10.

A timing clock generator 11 provides appropriate timings to the control signal generators 5 and 8. Namely, the timing clock generator 11 is connected with external control signal pins RASB, CASB and WEB, and is responsive to a row address strobe signal, a column address strobe signal and a write enable signal supplied thereto for sequentially producing internal timing clocks.

The prior art dynamic random access memory device selectively enters a standard mode and a refresh mode, and both write-in and read-out modes are referred to as the standard mode in this instance.

The standard mode has a read-out phase, a data amplification phase and a data restore/transfer phase. Data bits are read out from a row of memory cells to the bit line pairs in the read-out phase, and the small potential differences indicative of the read-out data bits are increased in magnitude by the sense amplifier circuits in the data amplification phase. In the data restore/transfer phase, the column selector unit 9 transfers one of the potential differences indicative of an accessed data bit or a potential difference indicative of a write-in data bit between the pair of data lines 10 and a selected sense amplifier circuit, and the other non-accessed data bits are restored in the memory cells again.

On the other hand, the refresh mode has the read-out phase, the data amplification phase and a data restore phase. The read-out phase and the data amplification phase are similar to those of the standard mode, and the column selector unit 9 isolates the pair of data lines 10 from the sense amplifier circuits in the data restore phase. For this reason, all of the read-out data bits are restored in the row of memory cells again.

Thus, the circuit behavior of the prior art dynamic random access memory device is similar except for the control of the column selector unit 9, and the refreshing sequence is hereinbelow described with reference to FIG. 2 of the drawings on the assumption that the memory cell M1 stores a data bit of logic "1" level equivalent to the high voltage level.

Before entry into the refresh mode, the precharge control signal EQ remains in the positive power voltage level Vcc, and the precharge circuit 4 charges the bit lines BLa and BLb to the intermediate voltage level Vint. All of the word lines WL1 to WLm remain in the ground voltage level, and the gate control signal TG of the positive high voltage level Vcc allows the transfer gate unit 7 to conduct the bit line pair BLa/BLb with the sense amplifier circuit 6.

If the row address strobe signal RASB goes down to the active low voltage level L at time t0, a refreshing cycle starts, and the control signal generator 5 firstly shifts the precharge control signal EQ to the ground voltage level GND at time t1. Then, the precharge circuit 4 isolates the bit line pair BLa/BLb from the precharge voltage line Vcc/2, and the bit lines BLa and BLb and the sense nodes SA1 and SA2 are maintained at the intermediate voltage level Vint. The refresh control system 3 supplies the refresh address signal indicative of the word line WL1 to the row address decoder/word line driver unit 2, and the row address decoder/word line driver unit 2 boosts the word line WL1 to a high voltage level Vh over the positive power voltage level Vcc at time t1.

The word line WL1 thus boosted allows the switching transistor of the memory cell M1 to turn on, and current flows out from the capacitor through the switching transistor into the bit line BLb. As a result, a small potential difference dV takes place between the bit lines BLa and BLb, and is transferred through the transfer gate unit 7 to the sense nodes SA1 and SA2.

The control signal generator 8 shifts the gate control signal TG to the ground voltage level at time t2, and the control signal generator 8 blocks the sense nodes SA1 and SA2 from the parasitic capacitance coupled with the bit line pair BLa and BLb. This means that the load of the sense amplifier circuit 6 is reduced.

The power voltage lines SEP and SEN are driven to the positive power voltage level and the ground voltage level at time t2, and the sense amplifier circuit 6 rapidly develops the small potential difference dV between the sense nodes SA1 and SA2. The isolation of the sense nodes SA1 and SA2 effectively accelerates the amplification.

After the potential difference between the sense nodes SA1 and SA2 is sufficiently developed, the row address strobe signal RASB is recovered from the low voltage level L to the high voltage level H at time t3, and the control signal generator 8 boosts the gate control signal TG to the high voltage level Vh. The large potential difference between the sense nodes SA1 and SA2 is propagated through the transfer gate unit 7 to the bit lines BLa and BLb, and the bit lines BLa and BLb propagate the large potential difference to the memory cell M1. The positive voltage level Vcc reaches the capacitor, and the data bit of logic "1" level is restored in the memory cell M1.

The word line WL1 goes down to the ground voltage level, and the precharge control signal EQ is lifted to the high voltage level. As a result, the memory cell M1 keeps the refreshed data bit therein, and the bit lines BLa and BLb and the sense nodes SA1 and SA2 are balanced at the intermediate voltage level again.

Thus, the transfer gate unit 7 conducts the bit lines BLa and BLb with and isolates then from the sense amplifier circuit 6, and the development of the potential difference is accelerated by virtue of reduction of the load. As described hereinbefore, the control signal generator 8 similarly controls the transfer gate unit 7 in the standard mode, and repeatedly charge, discharges and boosts the signal line for the gate control signal TG.

The complex gate control with the gate control signal TG is desirable for the acceleration of the data access, but consumes a large amount of electric power. As the dynamic random access memory device progressively increases the number of memory cells and, accordingly, the bit line pairs, and the consumption of electric power becomes serious.

SUMMARY OF THE INVENTION

It is therefore an important object of the present invention to provide a dynamic random access memory device which decreases the power consumption without sacrifice of the data access speed.

The present inventor noticed a refreshing cycle prolongable, and proposes to keep transfer gate units on-state in a refreshing mode.

In accordance with the present invention, there is provided a dynamic random access memory device having a read-out mode and a refresh mode of operation, comprising: a) a plurality of addressable memory cells respectively storing data bits; b) a plurality of bit line pairs selectively connected with the plurality of addressable memory cells; c) a plurality of word lines selectively connected with the plurality of addressable memory cells, and each driven to an active level for conducting addressable memory cells connected therewith with the plurality of bit line pairs; d) a plurality of sense amplifier circuits respectively associated with the plurality of bit line pairs, and operative to amplify data bits at respective sense node pairs thereof; e) a transfer gate unit connected between the plurality of bit line pairs and the plurality of sense node pairs, and responsive to a first gate control signal for conducting the plurality of bit line pairs with the plurality of sense node pairs; and f) a gate control means for producing the first gate control signal, the gate control means shifting the first gate control signal from an active level to an inactive level before the plurality of sense amplifier circuits start amplifying the data bits in the read-out mode, the gate control means shifting the first gate control signal from the inactive level to the active level after the plurality of sense amplifier circuits complete the amplification of the data bits in the read-out mode, the gate control means keeping the first gate control signal at the active level between a read-out of the data bits from the addressable memory cells coupled with the word line driven to the active level and a completion of the amplification of the data bits in the refresh mode.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
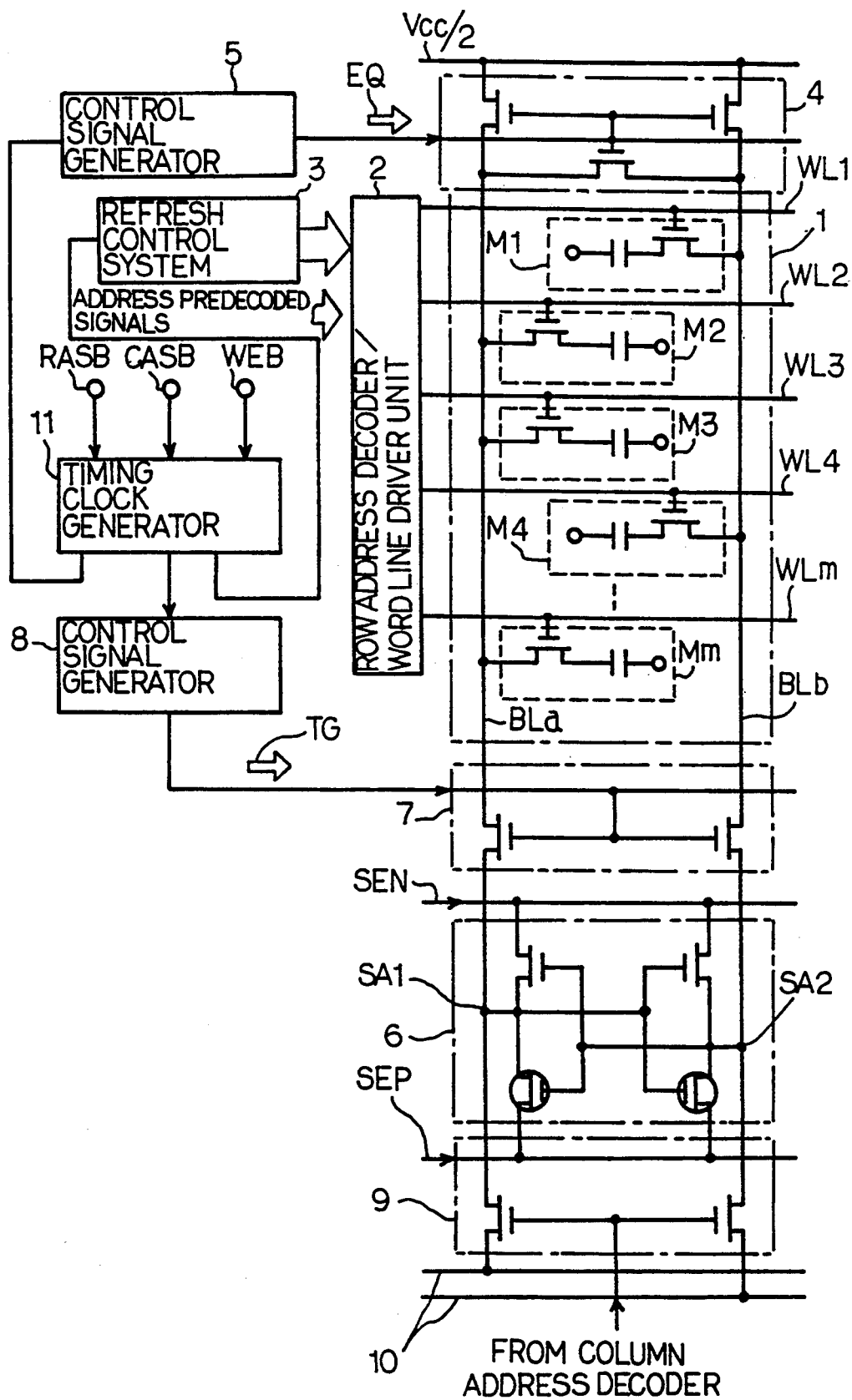
FIG. 1 is a circuit diagram showing the arrangement of the prior art dynamic random access memory device.
Figure 2:
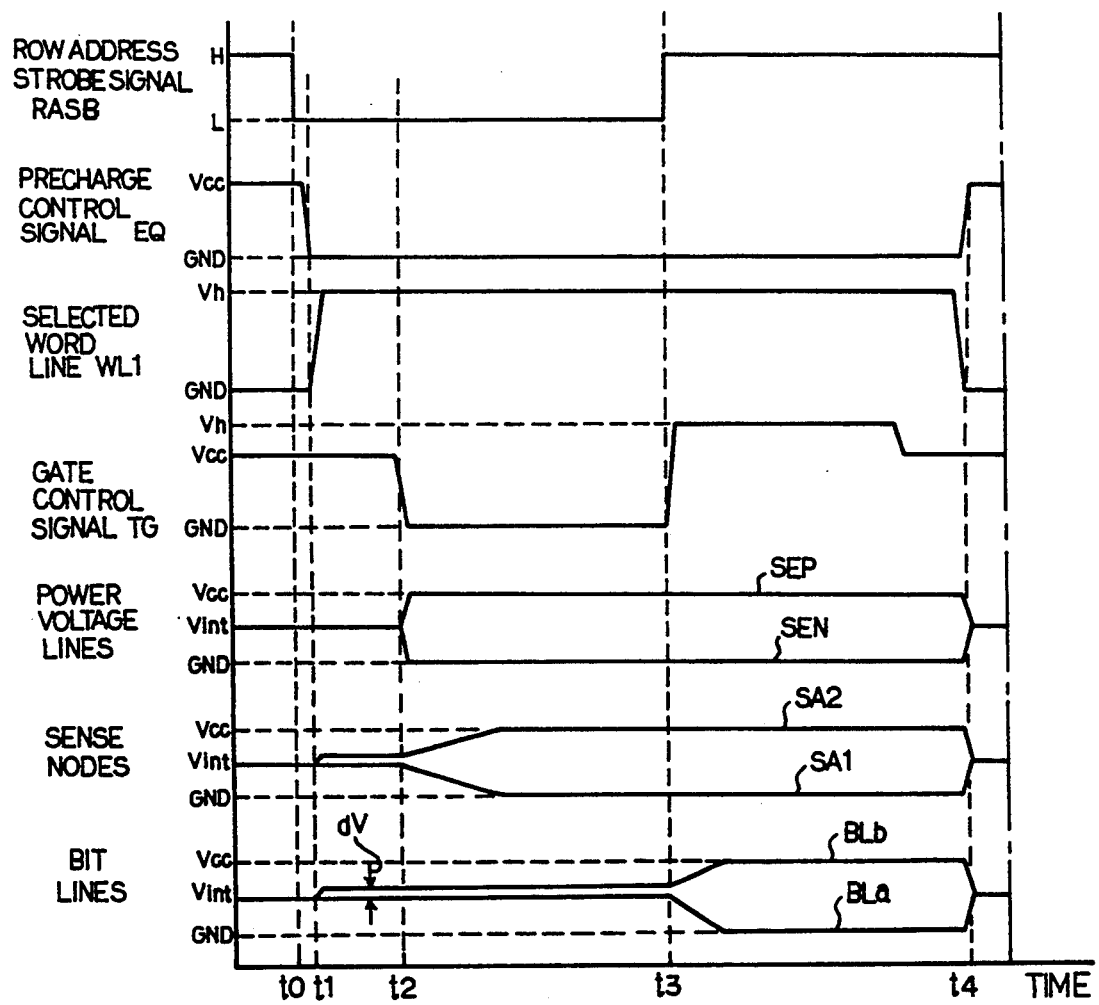
FIG. 2 is a timing chart illustrating the refreshing cycle of the prior art dynamic random access memory device.
Figure 3:
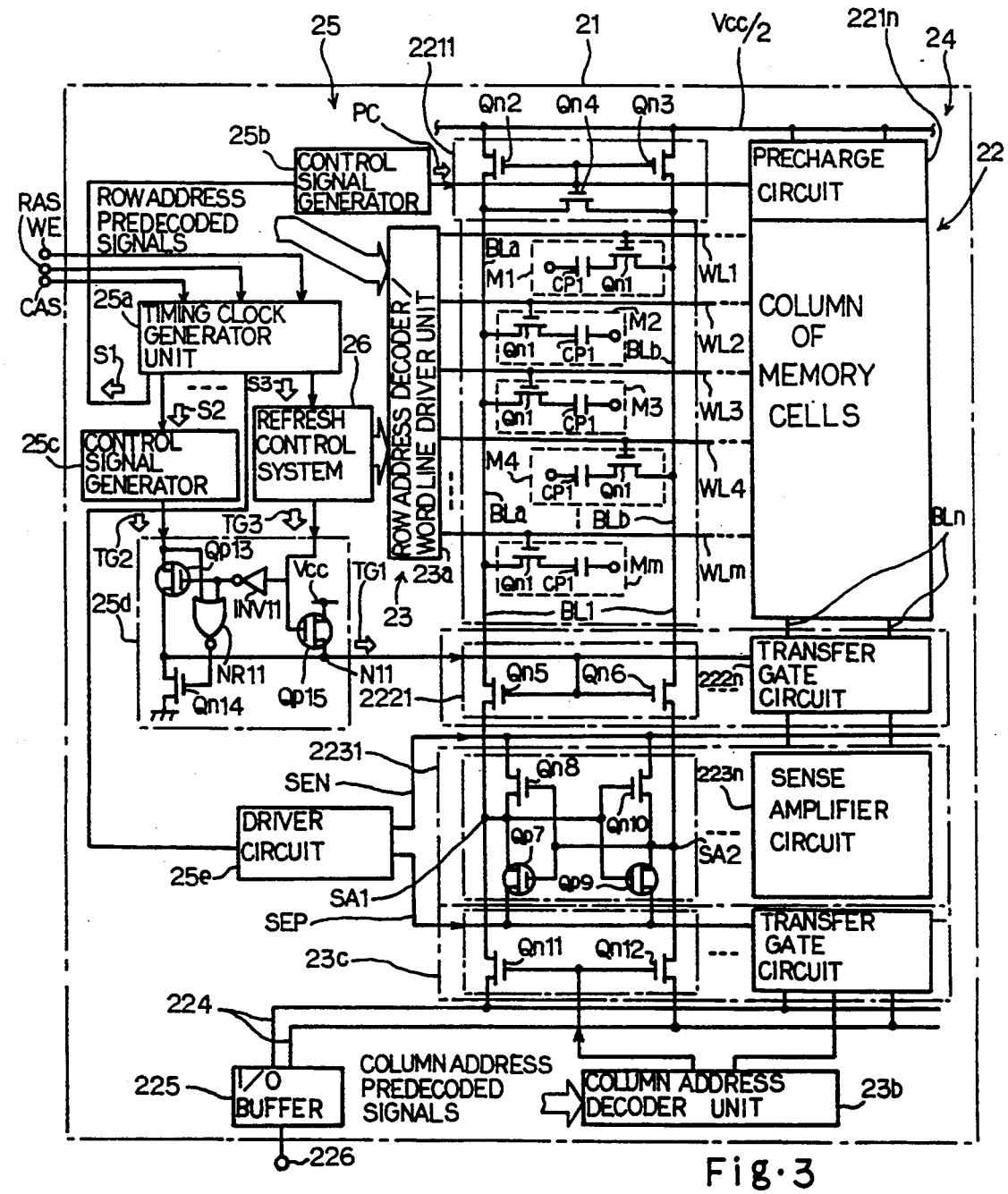
FIG. 3 is a circuit diagram showing the arrangement of a dynamic random access memory device according to the present invention.

Referring to FIG. 3 of the drawings, a dynamic random access memory device embodying the present invention is fabricated on a single semiconductor chip 21, and largely comprises a memory cell array 22, an addressing system 23, a data propagation system 24, a controlling system 25 and a self-refreshing system 26. The dynamic random access memory device selectively enters a write-in mode, a read-out mode and a refreshing mode of operation, and serves as a data storage facility of an electronic system.

The memory cell array 22 has a plurality of memory cells arranged in rows and columns, a plurality of word lines WL1, WL2, WL3, WL4... and WLm respectively associated with the rows of memory cells and a plurality of bit line pairs BL1 to BLn respectively associated with the columns of memory cells. Each of the memory cells is implemented by a series combination of an n-channel enhancement type switching transistor Qn1 and a storage capacitor CP1, and a data bit is stored in the storage capacitor CP1 in the form of electric charge.

The word lines WL1 to WLm are coupled with the gate electrodes of the n-channel enhancement type switching transistors of the associated rows of memory cells, and one of the word lines WL1 to WLm is driven over a positive power voltage level Vcc for conducting the storage capacitors CP1 to the bit line pairs B11 to BLn, respectively.

Each of the bit line pairs BL1 to BLn consists of two bit lines BLa and BLb, and the drain nodes of the switching transistors Qn1 in the associated column of memory cells are selectively connected with the bit lines BLa and BLb. For example, the memory cells M2, M3 and Mm are coupled with the bit line BLa, and the memory cells M1 and M4 are coupled with the other bit line BLb.

The data propagation system 22 comprises a plurality of precharge circuits 2211 to 221n respectively coupled with the bit line pairs BL1 to BLn, a plurality of transfer gate circuits 2221 to 222n respectively associated with the bit line pairs BL1 to BLn, a plurality of sense amplifier circuits 2231 to 223n each having a pair of sense nodes SA1 and SA2, a data bus 224 coupled with the sense amplifier circuits 2231 to 223n and an input/output data buffer circuit 225 coupled between the data bus 224 and an input/output data pin 226. The data propagation system 22 transfers an accessed data bit and a write-in data bit between one of the memory cells and the input/output data pin 226.

Namely, the precharge circuits 2211 to 221n are similarly arranged, and the precharge circuit 2211, by way of example, comprises a pair of n-channel enhancement type charging transistors Qn2 and Qn3 coupled between a precharge voltage line Vcc/2 and the associated bit line pair BL1 and an n-channel enhancement type balancing transistor Qn4 coupled between the bit lines BLa and BLb. A precharge control signal PC is supplied to the gate electrodes of the charging and balancing transistors Qn2 to Qn4 of all the precharge circuits 2211 to 221n, and the precharge circuits 2211 to 221n change and balance all of the bit lines BLa and BLb at an intermediate voltage level Vint between the positive power voltage level Vcc and the ground voltage level.

The transfer gate circuits 2221 to 222n are also similarly arranged, and the transfer gate circuit 2221 is, by way of example, implemented by a parallel combination of n-channel enhancement type switching transistors Qn5 and Qn6. The pair of n-channel enhancement type switching transistors Qn5 and Qn6 are connected between the associated bit line pair BLa and BLb and the pair of sense nodes SA1 and SA2 of the associated sense amplifier circuit 2231. A first gate control signal TG1 is supplied to the gate electrodes of the n-channel enhancement type switching transistors Qn5 and Qn6 of all the transfer gate circuits 2221 to 222n, and the transfer gate circuits 2221 to 222n conducts the associated bit line pairs B11 to BLn with and isolates them from the pairs of sense nodes SA1 and SA2 of the associated sense amplifier circuits 2231 to 223n.

The sense amplifier circuits 2231 to 223n have the same circuit configuration, and each of the sense amplifier circuits 2231 to 223n is implemented by two complementary inverters, i.e., two parallel combinations of p-channel enhancement type switching transistors and n-channel enhancement type switching transistors Qp7/Qn8 and Qp9/Qn10. The complementary inverters are coupled between two power supply lines SEP and SEN, and the input node and the output node of each complementary inverter are coupled with the sense nodes SA1 and SA2, respectively, for increasing a potential difference.

The data bus 224 propagates a potential difference from and to the input and output data buffer circuit 225. The input and output data buffer circuit 225 produces an output data signal from the potential difference on the data bus 224 in the read-out mode and a potential difference from an input data signal in the write-in mode.

The addressing system 23 comprises a row address decoder/ word line driver unit 23a, a column address decoder unit 23b and a column selector unit 23c. The row address decoder/word line driver unit 23a is responsive to row address predecoded signals and a refresh address signal for driving one of the word lines WL1 to WLm to a boosted voltage level Vh over the positive high voltage level Vcc. The row address predecoded signals are produced from an external row address signal in the write-in and read-out modes, and the refresh address signal is supplied from the refresh control system 26 in the refreshing mode.

The column address decoder unit 23b is responsive to column address predecoded signals for selectively driving column address decoded signal lines, and the column address predecoded signals are produced from an external column address signal in the write-in and read-out modes.

The column selector unit 23c comprises a plurality of transfer gate circuits each implemented by a parallel combination of n-channel enhancement type switching transistors Qn11 and Qn12, and is responsive to the column address decoded signals for coupling one of the pairs of sense nodes SA1 and SA2 with the data bus 224. As described hereinbefore, the column address decoded signals are produced in the write-in and read-out modes only, and the sense amplifier circuits 2231 to 223n are isolated from the data bus in the refreshing mode.

The controlling system 25 comprises a timing clock generator unit 25a, control signal generators 25b and 25c, an arbiter 25d and a driver circuit 25e. The timing clock generator unit 25a is connected with a write enable signal pin WE, a row address strobe signal pin RAS and a column address strobe signal pin CAS, and produces internal signals. First predetermined internal signals define a read-out cycle in the read-out mode, second predetermined internal signals define a write-in cycle in the write-in mode, and third predetermined internal signals define a refreshing cycle in the refreshing mode. Some of the internal signals serve as the first predetermined internal signals, the second predetermined internal signals and the third predetermined internal signals, but other internal signals are exclusively used in the read-out cycle, the write-in cycle, or the refreshing cycle. For example, the internal signal S1 causes the control signal generator 25b to produce the precharge control signal PC in all the read-out, write-in, and refreshing cycles, and the internal signal S2 also causes the control signal generator 25c to produce a second gate control signal TG2. However, the internal control signal S3 is supplied to the self-refresh control system 26 in the refreshing mode only, and causes the self-refresh control system 26 to produce a third gate control signal TG3.

The arbiter 25d comprises a series combination of a p-channel enhancement type switching transistor Qp13 and an n-channel enhancement type switching transistor Qn14, a p-channel enhancement type charging transistor Qp15, an inverter INV11 and a NOR gate NR11. The complementary inverter is coupled between the input node for the second gate control signal TG2 and a ground voltage line, and the common drain node is coupled with an output node N11. the p-channel enhancement type charging transistor Qp15 is coupled between the positive power voltage line Vcc and the output node N11, and is gated by the third gate control signal TG3. The inverter INV11 has an input node coupled with the input node for the third gate control signal TG3, and produces the complementary third gate control signal. The complementary third gate control signal switches the p-channel enhancement type switching transistor Qp13. The second gate control signal and the complementary third gate control signal are supplied to the NOR gate NR11, and switch the n-channel enhancement type switching transistor Qn14.

The arbiter thus arranged behaves as follows. While the dynamic random access memory device is serving in the read-out and write-in modes, the internal signal S3 causes the refresh control system to keep the third gate control signal TG3 high, and the control signal generator 25c swings the second gate control signal TG2 between the positive power voltage level and the ground voltage level at appropriate timings. In this situation, the arbiter 25d gives the priority to the second gate control signal TG2. Namely, the third gate control signal TG3 keeps the p-channel enhancement type charging transistor Qp15 off, and any current path is established through the p-channel enhancement type charging transistor Qp15. Moreover, the complementary third gate control signal enables the NOR gate NR11, and keeps the p-channel enhancement type switching transistor on. Then, the p-channel enhancement type switching transistor Qp13 transfers the second gate control signal TG2 to the output node N11, and the NOR gate NR11 switches the n-channel enhancement type switching transistor Qn14 between on-state and off-state. For example, if the second gate control signal TG2 is in the positive high voltage level, the NOR gate NR11 switches the n-channel enhancement type switching transistor Qn14 off, and the second gate control signal TG2 of the positive high voltage level is supplied to the output node N11. On the other hand, if the second gate control signal is in the ground voltage level, the NOR gate NR11 switches the n-channel enhancement type switching transistor Qn14 on, and the output node N11 is grounded therethrough.

Figure 4:
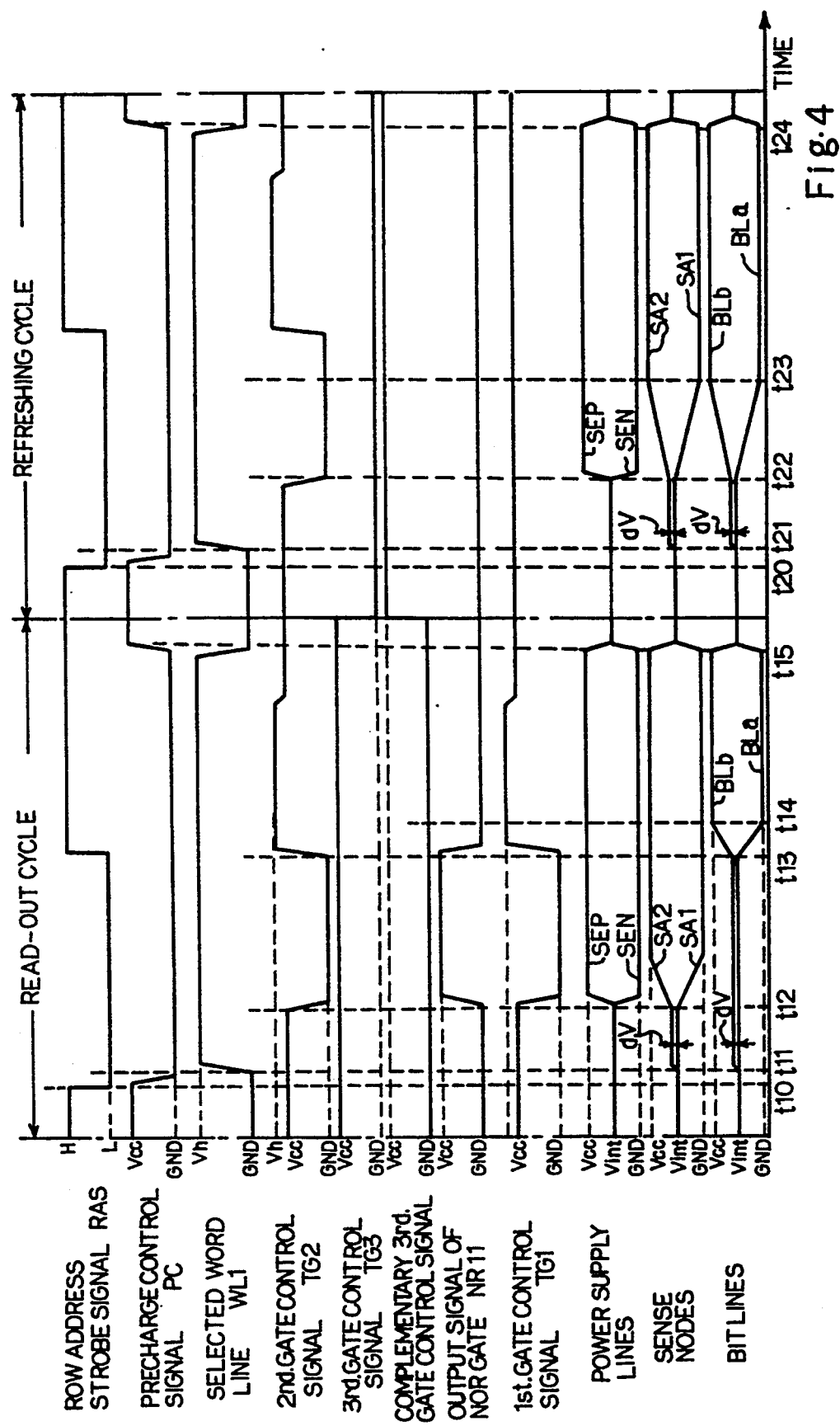
FIG. 4 is a timing chart illustrating a read-out cycle and a refreshing cycle of the dynamic random access memory device according to the present invention.

Description is made on circuit behavior with reference to FIG. 4 on the assumption that the memory cell M1 stores a data bit of logic "1" level equivalent to the positive high voltage level.

First, the dynamic random access memory device is assumed to be established in the read-out mode, and the arbiter 25d gives the priority to the second gate control signal TG2. The row address strobe signal RAS goes down at time t10, and the precharge control signal PC goes down to the ground voltage level so that the precharge circuits 2211 to 221n isolate the bit line pairs BL1 to BLn from the precharge voltage line Vcc/2.

The row address decoder/word line driver unit 23a boosts the word line WL1 over the positive power voltage level Vcc in response to the row address predecoded signals at time t11, and the switching transistors Qn1 coupled therewith turn on. Then, data bits are read out from the row of memory cells to the bit line pairs BL1 to BLn, and small potential differences dV take place on the respective bit line pairs BL1 to BLn. The arbiter 25d transfers the second gate control signal TG2 to the output node N11 in the presence of the third gate control signal TG3 of the positive high voltage level, and the second gate control signal TG2 of the positive high voltage level causes the transfer gate circuits 2221 to 222n to conduct the bit line pairs BL1 to BLn with the sense amplifier circuits 2231 to 223n. The data bit of logic "1" level slightly lifts the bit line BLb of the bit line pair BL1, and is propagated to the sense nodes SA1 and SA2 of the sense amplifier circuit 2231.

At time t12, the second gate control signal TG2 goes down to the ground voltage level, and the driver circuit 25e energizes the power supply lines SEP and SEN to the positive high voltage level and the ground voltage level, respectively. The arbiter 25d transfers the second gate control signal TG2 to the output node N11, and the transfer gate circuits 2221 to 222n turn off with the first gate control signal TG1 identical with the second gate control signal TG2. Then, the capacitive load coupled with each sense amplifier circuit is decreased, and all of the sense amplifier circuits 2231 to 223n start developing the small potential differences dV. The sense amplifier circuits 2231 to 223n rapidly develop the potential differences due to the small capacitive load.

At time t13, the second gate control signal TG2 is boosted over the positive power voltage level Vcc, and the first gate control signal TG1 allows the transfer gate circuits 2221 to 222n to turn on. The large potential differences are propagated through the transfer gate circuits 2221 to 222n to the bit line pairs BL1 to BLn, and reaches the bit line pairs BL1 to BLn at time t14. The word line WL1 remains at the boosted voltage level Vh, and the data bits indicated by the positive power voltage level Vcc and/or the ground voltage level are restored in the memory cells coupled with the word line WL1.

Though not shown in FIG. 4, the column address decoder unit 23b causes one of the sense amplifier circuits 2231 to 223n to conduct with the data bus 224, and the input/output data buffer circuit 225 produces the output data signal from the potential difference on the data bus 224.

At time t15, the precharge control signal PC goes up to the positive power voltage level Vcc, and the bit lines BL1 to BLn and the sense nodes SA1 and SA2 are charged to the intermediate voltage level vint again. The word line WL1 is recovered from the boosted voltage level Vh, and the row of memory cells are isolated from the bit line pairs BL1 to BLn.

On the other hand, when the dynamic random access memory device enters the refreshing mode, the arbiter 25d gives the priority to the third gate control signal TG3.

If the row address strobe signal RAS goes down at time t20, the precharge control signal PC follows, and the precharge circuits 2211 to 221n isolate the bit line pairs BL1 to BLn from the precharge voltage line Vcc/2. The third gate control signal TG3 keeps the first gate control signal TG1 at the positive high voltage level, and not only the bit line pairs BL1 to BLn but also the sense nodes SA1 and SA2 have already charged to the intermediate voltage level Vcc/2.

The self-refresh control system 26 acknowledges the internal signal S3, and supplies the refresh address signal indicative of the word line WL1 to the row address decoder/word line driver unit 23a. The row address decoder/word line driver unit 23a boosts the word line WL1 over the positive power voltage level Vcc, and the bit line pairs BL1 to BLn are conducted with the storage capacitors of the memory cells associated with the word line WL1. As a result, small potential differences dV take place on the bit lines at time t21, and the bit line BLb of the pair BL1 is slightly lifted from the intermediate voltage level Vint.

The third gate control signal TG3 is kept at the ground voltage level, and the p-channel enhancement type charging transistor Qp15 keeps the first gate control signal TG1 at the positive high voltage level. With the first gate control signal TG1, the transfer gate circuits 2221 to 222n conduct the bit line pairs BL1 to BLn with the sense amplifier circuits 2231 to 223n, and the sense amplifier circuits 2231 to 223n are expected to drive the capacitive loads coupled with the sense nodes SA1 and SA2 as well as with the associated bit line pairs BL1 to BLn.

At time t22, the driver circuit 25e drives the power supply lines SEP and SEN to the positive power voltage level Vcc and the ground voltage level, respectively, and the sense amplifier circuits 2231 to 223n increase the small potential differences. As will be seen from the plots between time t22 and time t23, the potential differences are gradually increased due to the large capacitive loads. However, such a slow development is not a problem in the refreshing cycle.

At time t23, the sense nodes SA1 and SA2 and the bit line pairs BL1 to BLn are simultaneously split between the positive power voltage level Vcc and the ground voltage level. Since the word line WL1 is kept at the boosted voltage level, the data bits indicated by the positive power voltage level vcc and/or the ground voltage level are restored in the memory cells coupled with the word line WL1.

At time 25, the precharge control signal PC goes up to the positive power voltage level Vcc, and the bit lines BL1 to BLn and the sense nodes SA1 and SA2 are charged to the intermediate voltage level vint again. The word line WL1 is recovered from the boosted voltage level Vh, and the row of memory cells are isolated from the bit line pairs BL1 to BLn.

Thus, the transfer gate circuits 2221 to 222n conduct the bit line pairs BL1 to BLn with the sense amplifier circuits 2231 to 223n throughout the refreshing cycle, and the control signal generator 25c does not repeat the charge, the discharge and bootstrapping on the signal line for the first gate control signal TG1. This results in reduction of the power consumption. However, the control signal generator 25c appropriately charges, discharges and boosts the signal line in the read-out and write-in modes, and the data access is never deteriorated.

Second Embodiment

Figure 5:
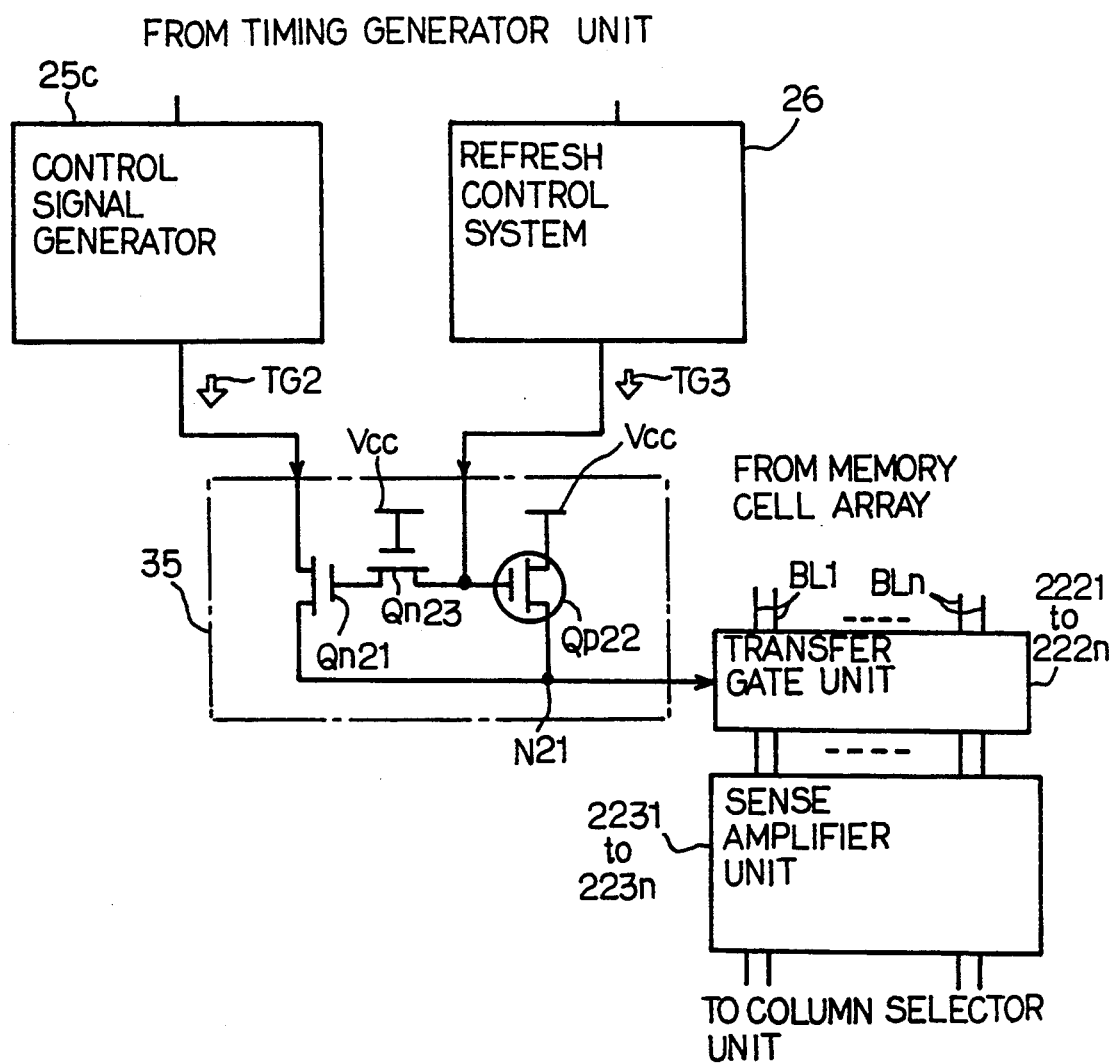
FIG. 5 is a circuit diagram showing the arrangement of an arbiter circuit incorporated in another dynamic random access memory device according to the present invention.

Turning to FIG. 5 of the drawings, an arbiter 35 incorporated in another dynamic random access memory device is associated with the control signal generator 25c and the self-refresh control system 26. The dynamic random access memory device implementing the second embodiment is similar to the first embodiment except for the arbiter 35, and no further description is made on the other components for the sake of simplicity.

The arbiter 35 comprises an n-channel enhancement type switching transistor Qn21 coupled between the input node for the second gate control signal TG2 and an output node N21, a p-channel enhancement type charging transistor Qp22 coupled between the positive power voltage line Vcc and the output node N21 and an n-channel enhancement type transfer transistor Qn23 coupled between the gate electrode of the n-channel enhancement type switching transistor Qn21 and the gate electrode of the p-channel enhancement type charging transistor Qp22. The third gate control signal TG3 is supplied to the gate electrode of the p-channel enhancement type charging transistor Qp22 and through the n-channel enhancement type transfer transistor Qn23 to the gate electrode of the n-channel enhancement type switching transistor Qn21.

While the dynamic random access memory device is in the read-out and write-in modes, the third gate control signal TG3 of the positive high voltage level causes the n-channel enhancement type switching transistor Qn21 to turn on and the p-channel enhancement type charging transistor Qp22 to turn off, and the control signal generator 25c controls the second gate control TG2 as similar to the first embodiment. For this reason, the transfer gate unit 2221 to 222n turns on and off at appropriate timings, and decreases the capacitive load coupled with the sense amplifier unit 2231 to 223n.

On the other hand, if the dynamic random access memory device enters into the refreshing mode, the self-refresh control system 26 changes the third gate control signal TG3 to the ground voltage level, and keeps the third gate control signal TG3 at the ground voltage level throughout the refreshing cycle. As a result, the n-channel enhancement type switching transistor Qn21 turns off, and the control signal generator 25c is isolated from the output node N21. The third gate control signal TG3 allows the p-channel enhancement type charging transistor Qp22 to turn on, and the transfer gate unit 2221 to 222n conducts the bit line pairs BL1 to BLn with the sense amplifier unit 2231 to 223n.

Therefore, the dynamic random access memory device implementing the second embodiment achieves the same advantages as the first embodiment. Moreover, the arbiter 35 is fabricated from a smaller number of transistors than the arbiter 25d.

Although particular embodiments of the present invention have been shown and described, it will be obvious to those skilled in the art that various changes and modifications may be made without departing from the spirit and scope of the present invention. For example, the control signal generator 25c may keep the second gate control signal at a constant voltage level in the refreshing cycle.

What is claimed is:

1. A dynamic random access memory device having a read-out mode and a refresh mode of operation, comprising:
   a) a plurality of addressable memory cells respectively storing data bits;
   b) a plurality of bit line pairs selectively connected with said plurality of addressable memory cells;
   c) a plurality of word lines selectively connected with said plurality of addressable memory cells, and each driven to a first active level for conductively connecting addressable memory cells connected therewith with said plurality of bit line pairs;
   d) a plurality of sense amplifier circuits respectively associated with said plurality of bit line pairs, and operative to amplify data bits at respective sense node pairs thereof;

e) a transfer gate unit connected between said plurality of bit line pairs and said plurality of sense node pairs, and responsive to a first gate control signal for conductively connecting said plurality of bit line pairs with said plurality of sense node pairs; and f) a gate control means for producing said first gate control signal, said gate control means shifting said first gate control signal from a second active level to an inactive level before said plurality of sense amplifier circuits start amplifying said data bits in said read-out mode, said gate control means shifting said first gate control signal from said inactive level to a third active level after said plurality of sense amplifier circuits complete the amplification of said data bits in said read-out mode, and said gate control means keeping said first gate control signal at said second active level to keep said transfer gate unit in an on-state during that portion of said refresh mode between a read-out for refresh purposes of said data bits from the addressable memory cells coupled with the word line driven to said first active level and a completion of said amplification of said data bits in said refresh mode, said second active level and said third active level allowing a potential difference indicative of a logic level of a data bit to pass said transfer gate unit.

2. A dynamic random access memory device having a read-out mode and a refresh mode of operation, comprising;

a) a plurality of addressable memory cells respectively storing data bits;

b) a plurality of bit line pairs selectively connected with said plurality of addressable memory cells;

c) a plurality of word lines selectively connected with said plurality of addressable memory cells, and each driven to a first active level for conductively connecting addressable memory cells connected therewith with said plurality of bit line pairs;

d) a plurality of sense amplifier circuits respectively associated with said plurality of bit line pairs, and operative to amplify data bits at respective sense node pairs thereof;

e) a transfer gate unit connected between said plurality of bit line pairs and said plurality of sense node pairs, and responsive to a first gate control signal for conductivety connecting said plurality of bit line pairs with said plurality of sense node pairs; and f) a gate control means for producing said first gate control signal, said gate control means shifting said first gate control signal from a second active level to an inactive level before said plurality of sense amplifier circuits start amplifying said data bits in said read-out mode, said gate control means shifting said first gate control signal from said inactive level to a third active level after said plurality of sense amplifier circuits complete the amplification of said data bits in said read-out mode, and said gate control means keeping said first gate control signal at said second active level between a read-out of said data bits from the addressable memory cells coupled with the word line driven to said first active level and a completion of said amplification of said data bits in said refresh mode, said second active level and said third active level allowing a potential difference indicative of a logic level of a data bit to pass said transfer gate unit, said gate control means comprising a timing clock generating unit responsive to external control signals for selectively producing internal signals, a control signal generator responsive to one of said internal signals in at least said read-out mode for producing a second gate control signal, said second gate control signal being changed from said second active level to said inactive level before said plurality of sense amplifier circuits amplify said data bits, and said second gate control signal being changed from said inactive level to said third active level after said completion of said amplification, a refresh control system responsive to another of said internal signals in said refreshing mode for producing a third gate control signal of a fourth active level allowing said active and inactive levels to pass said transfer gate unit, and an arbiter operative to allow said second gate control signal to serve as said first gate control signal in said read-out mode and to allow said third gate control signal to serve as said first gate control signal in said refreshing mode.

3. The dynamic random access memory device as set forth in claim 2, in which said arbiter comprises a series combination of a first switching transistor of one channel conductivity type and a second switching transistor of the opposite channel conductivity type to said one channel conductivity type coupled between an input node for said second gate control signal and a first source of constant voltage, a common node between said first switching transistor and said second switching transistor being connected with an output node of said arbiter, a first charging transistor of said one channel conductivity type coupled between said output node of said arbiter and a second source of constant voltage different in voltage level from said first source of voltage and responsive to said third gate control signal for producing said first gate control signal, an inverter supplied with said third gate control signal for producing a complementary third gate control signal, said first switching transistor being responsive to said complementary third gate control signal so that said first switching transistor and said first charging transistor being complimentarily shifted between on-state and off-state, and a logic gate enabled with said complementary third gate control signal, and responsive to said second gate control signal for supplying a complementary second gate control signal to said second switching transistor.

4. The dynamic random access memory device as set forth in claim 2, in which said arbiter comprises a charging transistor of one channel conductivity type coupled between a current source and an output node of said arbiter and responsive to said third gate control signal of said second active level for producing said first gate control signal, a switching transistor of the opposite channel conductivity type to said one channel conductivity type connected between said output node of said arbiter and an input node for said second gate control signal and responsive to said third gate control signal of the inactive level for transferring said second gate control signal as said first gate control signal, and a transfer transistor of said opposite channel conductivity type coupled between a gate electrode of said charging transistor and a gate electrode of said switching transistor and operative to transfer said third gate control signal to said gate electrode of said switching transistor.

* * * * *

UNITED STATES PATENT AND TRADEMARK OFFICE
CERTIFICATE OF CORRECTION

PATENT NO.   : 5,418,753
DATED        : May 23, 1995
INVENTOR(S)  : Kazumi SEKI

It is certified that error(s) appears in the above-identified patent and that said Letters Patent is hereby corrected as shown below:

Col. 3, line 43, delete "then" and insert --them--.

Col. 5, line 13, delete "B11" and insert --BL1--.

Col. 5, line 63, delete "B11" and insert --BL1--.

Col. 11, line 51, delete "conductivety" and insert --conductively--.

Signed and Sealed this

Twelfth Day of March, 1996

*Attest:*

BRUCE LEHMAN

*Attesting Officer*          *Commissioner of Patents and Trademarks*